(12) United States Patent
Saturley et al.

(10) Patent No.: US 9,759,235 B2
(45) Date of Patent: Sep. 12, 2017

(54) TELECOMMUNICATIONS SYSTEM COOLING FAN INCORPORATING A FLANGE VIBRATION ISOLATOR

(71) Applicant: Ciena Corporation, Hanover, MD (US)

(72) Inventors: Peter Saturley, Ottawa (CA); Trevor Meunier, Ottawa (CA)

(73) Assignee: Ciena Corporation, Hanover, MD (US)

( * ) Notice: Subject to any disclaimer, the term of this patent is extended or adjusted under 35 U.S.C. 154(b) by 223 days.

(21) Appl. No.: 14/681,556

(22) Filed: Apr. 8, 2015

(65) Prior Publication Data

US 2016/0298652 A1 Oct. 13, 2016

(51) Int. Cl.
*F04D 29/66* (2006.01)
*F04D 25/06* (2006.01)
*F04D 29/60* (2006.01)

(52) U.S. Cl.
CPC ....... *F04D 29/668* (2013.01); *F04D 25/0613* (2013.01); *F04D 29/601* (2013.01)

(58) Field of Classification Search
CPC ............ H05K 7/20172; H05K 7/20136; F04D 29/668
See application file for complete search history.

(56) References Cited

U.S. PATENT DOCUMENTS

| 7,748,955 B2* | 7/2010 | Lee ....................... F04D 29/601 361/679.48 |
| 8,043,049 B2* | 10/2011 | Chen ................... F04D 25/0613 415/119 |
| 2013/0045108 A1* | 2/2013 | Zhou ..................... F04D 29/602 416/244 R |

FOREIGN PATENT DOCUMENTS

JP WO 2012169036 A1 * 12/2012 ........... F04D 29/601

* cited by examiner

*Primary Examiner* — Justin Seabe
(74) *Attorney, Agent, or Firm* — Clements Bernard Walker PLLC; Christopher L. Bernard; Lawrence A. Baratta, Jr.

(57) ABSTRACT

A cooling fan assembly for use in a telecommunications system, the cooling fan assembly including: a cooling fan including a plurality of radially disposed mounting flanges that are recessed from one or more of an inlet surface and an exhaust surface of the cooling fan; a chassis disposed adjacent to one or more of the inlet surface and the exhaust surface of the cooling fan, wherein a plurality of spaces are formed between the plurality of mounting flanges and the chassis; a plurality of vibration isolators disposed within the plurality of spaces formed between the plurality of mounting flanges and the chassis; and a plurality of rigid pins coupling the chassis to the plurality of vibration isolators. The plurality of vibration isolators are disposed substantially within a volumetric envelope of the cooling fan and the plurality of mounting flanges.

20 Claims, 8 Drawing Sheets

TELECOMMUNICATIONS SYSTEM COOLING FAN INCORPORATING A FLANGE VIBRATION ISOLATOR

FIELD OF THE INVENTION

The present invention relates generally to a telecommunications system cooling fan. More specifically, the present invention relates to a telecommunications system cooling fan incorporating a flange vibration isolator.

BACKGROUND OF THE INVENTION

Vibration induced connector damage is common on the cooling units and associated backplane connectors used in telecommunications systems. Typical vibration mitigation strategies involve the use of dampers or bushings that are added to the mounting points of the cooling fans, typically above and below the cooling fans. This, however, requires an increase in the size of the cooling units. If space is not available within the broader telecommunications system, then dimensions must be enlarged, and a full redesign must be undertaken, resulting in significant delay and expense. Further, valuable space must be allocated which may be reserved for other functions and a full redesign is not an option for already deployed telecommunications systems.

Similarly, the geometry of conventional cooling units does not allow for a set of large isolator flanges (relative to the size of the cooling fans) to be used to isolate the cooling units from the rest of the telecommunications system. Such large isolator flanges would provide superior vibration damping, provided they may be used in the compact space provided, substantially within the existing cooling fan envelope, and in multiple orientations.

Thus, what is still needed in the art is a compact vibration isolator that works with existing cooling units and conserves valuable space. What is also still needed in the art is a large isolator flange and isolator flange geometry that may be used in a compact cooling unit space, substantially within the existing cooling fan envelope, and in multiple orientations. Such an isolator flange geometry would maximize volume and thickness.

BRIEF SUMMARY OF THE INVENTION

In various exemplary embodiments, the present invention provides a cooling fan that incorporates a compact vibration isolator including a rigid pin, a low-friction washer, and a cylindrical vibration isolator. This compact vibration isolator is used at each connection point between the cooling fan and the associated chassis. Collectively, these compact vibration isolators allow the cooling fan to move freely within the chassis without the conduction of vibration to the housing of the cooling unit, while dissipating the energy of any vibration. The compact vibration isolators mount almost entirely within the cooling fans mounting holes, allowing them to be used in cooling units in which space has not been allocated for conventional vibration isolators, such as elastomer pads or bumpers. The compact vibration isolators work in any orientation, allowing them to be used with cooling units that are installed in multiple orientations.

In one exemplary embodiment, the present invention provides a cooling fan assembly for use in a telecommunications system, including: a cooling fan; a housing; a rigid pin disposed through the housing an into a mounting hole manufactured into the cooling fan; a vibration isolator disposed about the rigid pin within the mounting hole; and a washer disposed about the rigid pin between the cooling fan and the housing. The vibration isolator is a cylindrical vibration isolator. The vibration isolator is made of a polymeric vibration damping material. The washer is made of a material with a low coefficient of friction. The vibration isolator is operable for damping vibrations emanating from the cooling fan. The washer is operable for allowing some movement of the cooling fan perpendicular to the rigid pin.

In another exemplary embodiment, the present invention provides a method for providing a cooling fan assembly for use in a telecommunications system, including: providing a cooling fan; providing a housing; disposing a rigid pin through the housing an into a mounting hole manufactured into the cooling fan; disposing a vibration isolator about the rigid pin within the mounting hole; and disposing a washer about the rigid pin between the cooling fan and the housing. The vibration isolator is a cylindrical vibration isolator. The vibration isolator is made of a polymeric vibration damping material. The washer is made of a material with a low coefficient of friction. The vibration isolator is operable for damping vibrations emanating from the cooling fan. The washer is operable for allowing some movement of the cooling fan perpendicular to the rigid pin.

In a further exemplary embodiment, the present invention provides a cooling fan vibration isolator for use in a telecommunications system, including: a rigid pin disposed through a housing an into a mounting hole manufactured into a cooling fan; a vibration isolator disposed about the rigid pin within the mounting hole; and a washer disposed about the rigid pin between the cooling fan and the housing. The vibration isolator is a cylindrical vibration isolator. The vibration isolator is made of a polymeric vibration damping material. The washer is made of a material with a low coefficient of friction. The vibration isolator is operable for damping vibrations emanating from the cooling fan. The washer is operable for allowing some movement of the cooling fan perpendicular to the rigid pin.

In various exemplary embodiments, the present invention also provides a cooling fan that incorporates a flange vibration isolator that is made of a polymeric material and that substantially matches the geometry of the cooling fan. The cooling fan also incorporates a rigid pin, such as a metallic pin. Preferably, the mounting flanges are located away from the fan inlet and exhaust, creating room for the vibration isolators without significantly increasing the cooling fan envelope. The vibration isolators are disposed on these mounting flanges and may be secured to the cooling fan using an adhesive, interference fit, or a fastener. The vibration isolators fit over the rigid pins, which are fitted to the cooling fan housing in the locations typically intended for mounting screws. Such assembly is repeated at each of the cooling fan mounting points—either four (two per side) or eight (four per side), as required. The vibration isolators dissipate the energy from vibration and prevent it from being communicated to the rest of the telecommunications system, while the rigid pins prevent large motions of the cooling fan inside the overall assembly. In addition to dissipating the energy from vibration, the vibration isolators are also used to ensure that an appropriate gap exists between the cooling unit and the surrounding metalwork.

In one exemplary embodiment, the present invention provides a cooling fan assembly for use in a telecommunications system, the cooling fan assembly including: a cooling fan including a plurality of radially disposed mounting flanges that are recessed from one or more of an inlet surface and an exhaust surface of the cooling fan; a chassis disposed adjacent to one or more of the inlet surface and the exhaust surface of the cooling fan, wherein a plurality of spaces are formed between the plurality of mounting flanges and the chassis; a plurality of vibration isolators disposed within the plurality of spaces formed between the plurality of mounting flanges and the chassis; and a plurality of rigid pins coupling the chassis to the plurality of vibration isolators. The plurality of vibration isolators are disposed substantially within a volumetric envelope of the cooling fan and the plurality of mounting flanges. The chassis is disposed adjacent to the one or more of the inlet surface and the exhaust surface of the cooling fan in a slightly spaced apart relationship with the inlet surface and the exhaust surface of the cooling fan. The plurality of vibration isolators are manufactured from a substantially compliant polymeric material. The plurality of rigid pins are manufactured from a substantially rigid metallic material. Optionally, two mounting flanges and two vibration isolators are used on an inlet side of the cooling fan and two mounting flanges and two vibration isolators are used on an exhaust side of the cooling fan. Alternatively, four mounting flanges and four vibration isolators are used on the inlet side of the cooling fan and four mounting flanges and four vibration isolators are used on the exhaust side of the cooling fan. Optionally, each of the plurality of vibration isolators includes one or more internal voids or rib structures. The plurality of vibration isolators are coupled the plurality of mounting flanges via an adhesive, an interference fit, or a fastener.

In another exemplary embodiment, the present invention provides a method for vibrationally isolating a cooling fan assembly used in a telecommunications system, the method including: providing a cooling fan including a plurality of radially disposed mounting flanges that are recessed from one or more of an inlet surface and an exhaust surface of the cooling fan; providing a chassis disposed adjacent to one or more of the inlet surface and the exhaust surface of the cooling fan, wherein a plurality of spaces are formed between the plurality of mounting flanges and the chassis; disposing a plurality of vibration isolators within the plurality of spaces formed between the plurality of mounting flanges and the chassis; and coupling the chassis to the plurality of vibration isolators using a plurality of rigid pins. The plurality of vibration isolators are disposed substantially within a volumetric envelope of the cooling fan and the plurality of mounting flanges. The chassis is disposed adjacent to the one or more of the inlet surface and the exhaust surface of the cooling fan in a slightly spaced apart relationship with the inlet surface and the exhaust surface of the cooling fan. The plurality of vibration isolators are manufactured from a substantially compliant polymeric material. The plurality of rigid pins are manufactured from a substantially rigid metallic material. Optionally, two mounting flanges and two vibration isolators are used on an inlet side of the cooling fan and two mounting flanges and two vibration isolators are used on an exhaust side of the cooling fan. Alternatively, four mounting flanges and four vibration isolators are used on the inlet side of the cooling fan and four mounting flanges and four vibration isolators are used on the exhaust side of the cooling fan. Optionally, each of the plurality of vibration isolators includes one or more internal voids or rib structures. The plurality of vibration isolators are coupled the plurality of mounting flanges via an adhesive, an interference fit, or a fastener.

In a further exemplary embodiment, the present invention provides a telecommunications shelf making up all or a portion of a telecommunications node, the telecommunications shelf including: a cooling fan including a plurality of radially disposed mounting flanges that are recessed from one or more of an inlet surface and an exhaust surface of the cooling fan; a chassis disposed adjacent to one or more of the inlet surface and the exhaust surface of the cooling fan, wherein a plurality of spaces are formed between the plurality of mounting flanges and the chassis; a plurality of substantially compliant vibration isolators disposed within the plurality of spaces formed between the plurality of mounting flanges and the chassis; and a plurality of substantially rigid pins coupling the chassis to the plurality of vibration isolators. The chassis is disposed adjacent to the one or more of the inlet surface and the exhaust surface of the cooling fan in a spaced apart relationship with the inlet surface and the exhaust surface of the cooling fan.

BRIEF DESCRIPTION OF THE DRAWINGS

The present invention is illustrated and described herein with reference to the various drawings, in which like reference numbers are used to denote like system components/method steps, as appropriate, and in which.

DETAILED DESCRIPTION OF THE INVENTION

Figure 1:
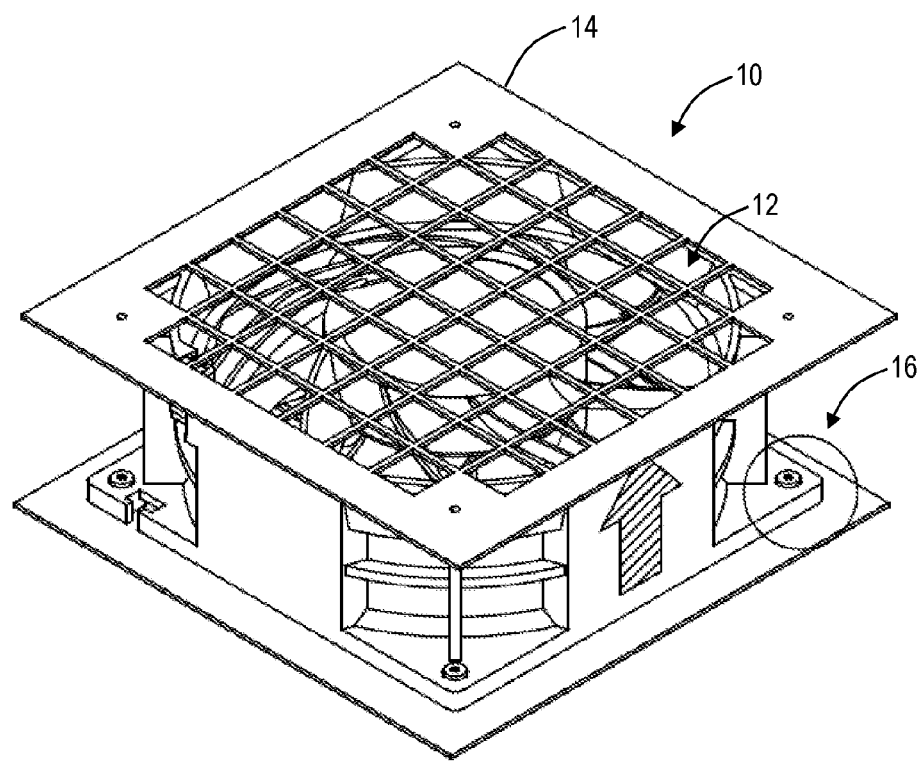
FIG. 1 is a perspective view of one exemplary embodiment of the cooling unit of the present invention.
Figure 2:
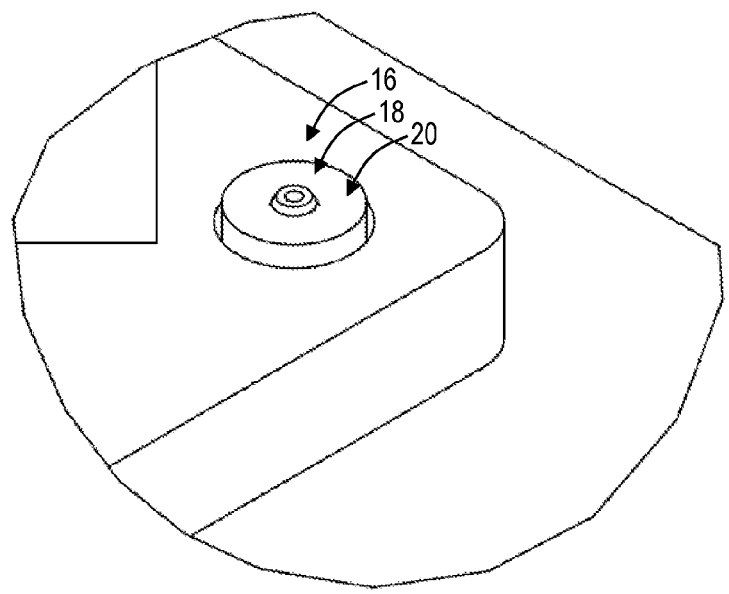
FIG. 2 is a perspective view of one exemplary embodiment of the compact vibration isolator of the present invention.
Figure 3:
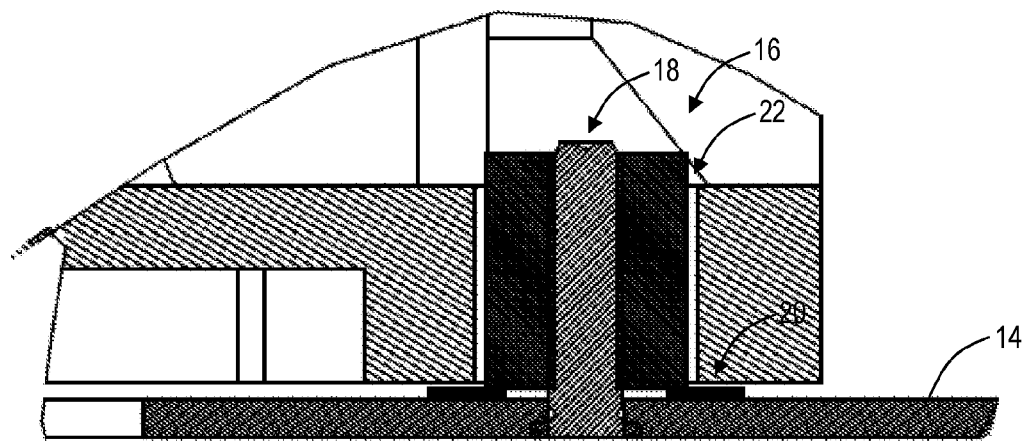
FIG. 3 is a cross-sectional view of one exemplary embodiment of the compact vibration isolator of the present invention.
Figure 4:
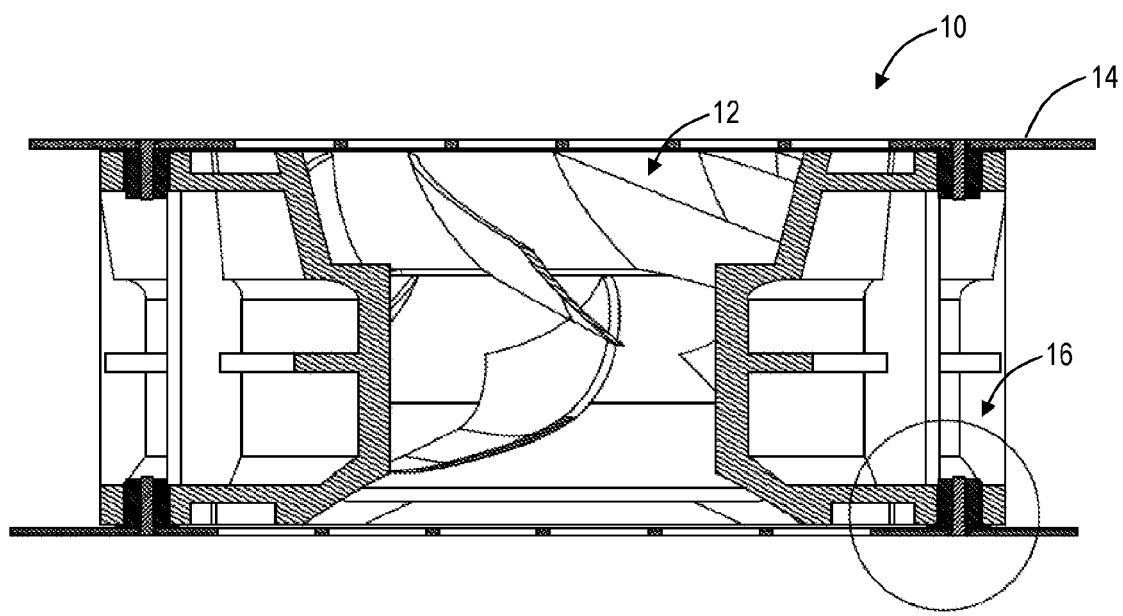
FIG. 4 is a cross-sectional view of one exemplary embodiment of the cooling unit of the present invention.

Again, in various exemplary embodiments, the present invention provides a cooling fan that incorporates a compact vibration isolator including a rigid pin, a low-friction washer, and a cylindrical vibration isolator. This compact vibration isolator is used at each connection point between the cooling fan and the associated chassis. Collectively, these compact vibration isolators allow the cooling fan to move freely within the chassis without the conduction of vibration to the housing of the cooling unit, while dissipating the energy of any vibration. The compact vibration isolators mount almost entirely within the cooling fans mounting holes, allowing them to be used in cooling units in which space has not been allocated for conventional vibration isolators, such as elastomer pads or bumpers. The compact vibration isolators work in any orientation, allowing them to be used with cooling units that are installed in multiple orientations.

Referring now specifically to FIGS. 1-4, in one exemplary embodiment, the cooling unit 10 includes a cooling fan 12 that is disposed within a fan housing 14. A compact vibration isolator 16 is disposed at each fan mounting point (of which there are typically eight (8)). Each compact vibration isolator 16 includes a metallic or rigid pin 18 that is press fit into or otherwise disposed through the fan housing 14. In one exemplary embodiment, this pin 18 has a length of between about 4 mm and about 10 mm. A low-friction washer 20 is disposed about the base of each pin 18. Preferably, this washer 20 is made from a material with a low coefficient of friction. In one exemplary embodiment, the washer 20 has an outer diameter of between about 5 mm and about 10 mm. A cylindrical vibration isolator 22 is then disposed about the pin 18. Preferably, this vibration isolator 22 is made from a polymeric vibration damping material. In one exemplary embodiment, the vibration isolator 22 has an outer diameter of between about 2.4 mm and about 4 mm. Although a "cylindrical" vibration isolator is illustrated and described herein, it will be readily apparent to those of ordinary skill in the art that other shapes or configurations may be used. This assembly is used at each fan mounting point. The cooling fan 12 is then disposed over the vibration isolators 16.

Figure 5:
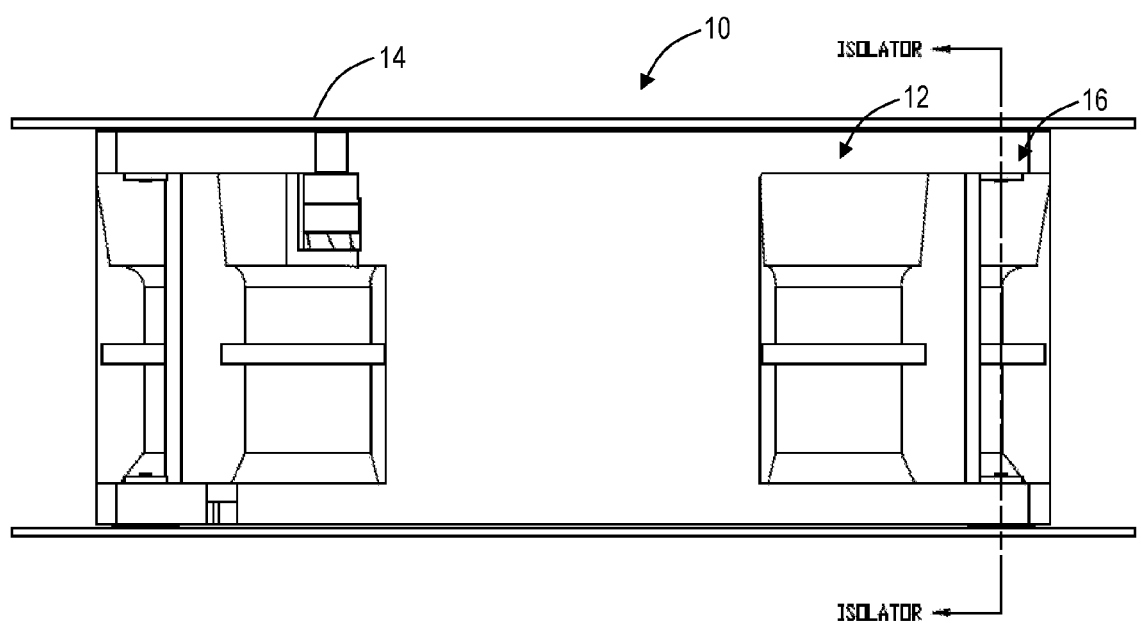
FIG. 5 is a planar view of one exemplary embodiment of the cooling unit of the present invention.

Referring now specifically to FIG. 5, it can be seen that the low-friction washers 20 (FIGS. 2 and 3) allow the fan 12 to move freely without the conduction of vibration to the housing 14 of the cooling unit 10, while the vibration isolators 22 dissipate the vibrational energy.

As discussed herein above, cooling fans are typically mounted to the chassis of a cooling unit using metallic screws or the like. This type of connection couples the vibration of the fan to the chassis and the rest of the telecommunications system. Under certain circumstances, this vibration can cause damage and premature failure of various components, and particularly connectors. Conventional vibration isolators consist of pads or other isolators that are disposed between the fan and the chassis, requiring significantly more space than the washers of the present invention.

Experiments have demonstrated that vibration generated by the fans within the plane of impeller rotation is of chief concern with respect to connector wear. Therefore, damping in the vertical direction is less critical. Placing only a very thin, low-friction washer between the fan and the chassis allows the fan to move from side to side without exerting a significant force on, or inducing vibration in, the chassis. The compliant isolator of the present invention instead damps the motion and prevents it from being transmitted to the chassis and the rest of the telecommunications system. The pin provides a mounting point for the washer and the isolator and prevents larger displacements of the fan.

Advantageously, the present invention locates most of the isolator within the mounting holes of the fan. The only part of the assembly that is external to the fan is the washer, which is manufactured to be negligibly thin compared to other components in the assembly. This allows the compact vibration isolator of the present invention to be used without taking up any additional system volume.

Vibration-induced connector damage is non-trivial and is the leading reason for communication loss with cooling units. Such connector damage may be rectified by replacing an affected cooling unit, but backplane connectors are not so easily replaced. Thus, this is a significant issue.

Figure 6:
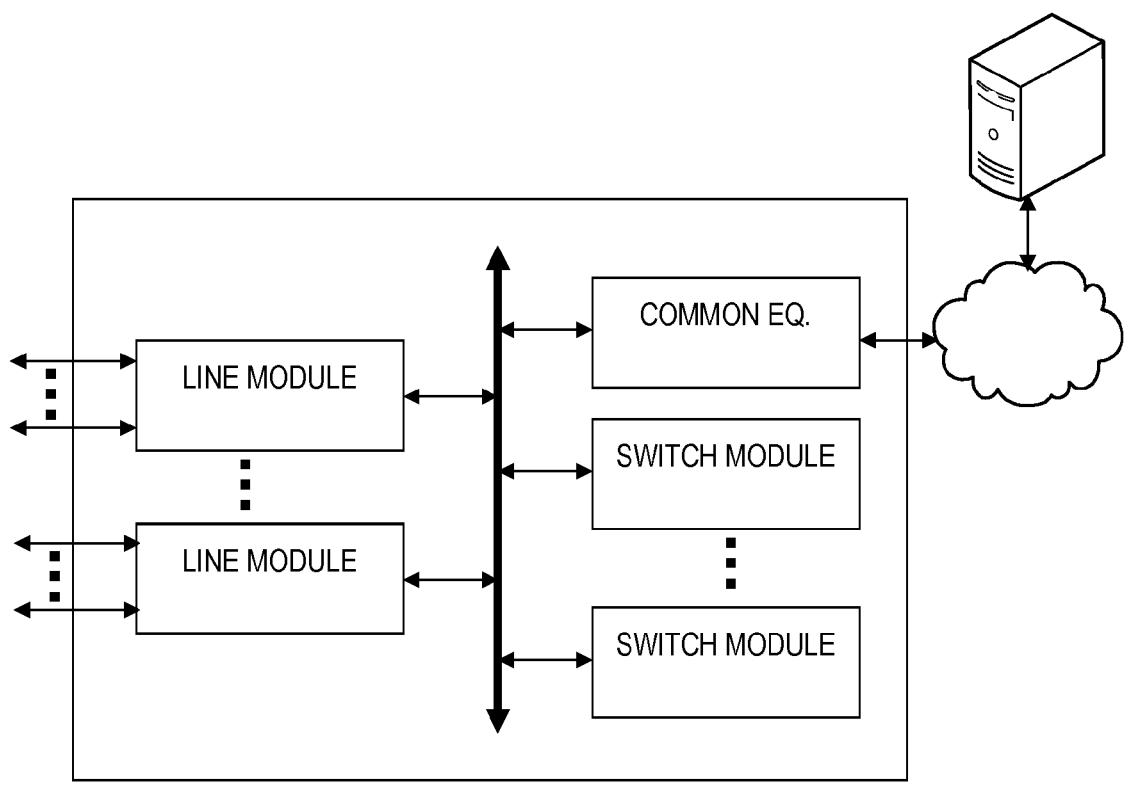
FIG. 6 is a block diagram illustrating an exemplary node for use with the systems and methods described herein.

Referring now specifically to FIG. 6, in one exemplary embodiment, an exemplary node or shelf with which the fan assembly of the present invention may be used is illustrated. The node can be a network element that may consolidate the functionality of a multi-service provisioning platform (MSPP), digital cross connect (DCC), Ethernet and/or Optical Transport Network (OTN) switch, dense wavelength division multiplexed (DWDM) platform, etc. into a single, high-capacity intelligent switching system providing Layer 0, 1, and/or 2 consolidation. In another exemplary embodiment, the node can be any of an OTN add/drop multiplexer (ADM), a multi-service provisioning platform (MSPP), a digital cross connect (DCC), an optical cross connect (OXC), an optical switch, a router, a switch, a wavelength division multiplexing (WDM) terminal, an access/aggregation device, etc. That is, the node can be any digital system with ingress and egress digital signals and switching there between of channels, timeslots, tributary units, etc. utilizing OTN, etc. While the node is generally shown as an optical network element, the systems and methods contemplated are for use with any switching fabric, network element, or network based thereon.

In an exemplary embodiment, the node includes common equipment, one or more line modules, and one or more switch modules. The common equipment can include power; a control module; operations, administration, maintenance, and provisioning (OAM&P) access; user interface ports; and the like. The common equipment can connect to a management system through a data communication network (as well as a PCE, SDN controller, OpenFlow controller, etc.). The management system can include a network management system (NMS), element management system (EMS), or the like. Additionally, the common equipment can include a control plane processor configured to operate the control plane. The node can include an interface for communicatively coupling the common equipment, the line modules, and the switch modules there between. For example, the interface can be a backplane, mid-plane, a bus, optical or electrical connectors, or the like. The line modules are configured to provide ingress and egress to the switch modules and external to the node. In an exemplary embodiment, the line modules can form ingress and egress switches with the switch modules as center stage switches for a three-stage switch, e.g. a three stage Clos switch. Other configurations and/or architectures are also contemplated. The line modules can include optical transceivers, such as, for example, 1 Gb/s (GbE PHY), 2.5 Gb/s (OC-48/STM-1, OTU1, ODU1), 10 Gb/s (OC-192/STM-64, OTU2, ODU2, 10 GbE PHY), 40 Gb/s (OC-768/STM-256, OTU3, ODU3, 40 GbE PHY), 100 Gb/s (OTU4, ODU4, 100 GbE PHY), ODUflex, etc.

Further, the line modules can include a plurality of optical connections per module and each module may include a flexible rate support for any type of connection, such as, for example, 155 Mb/s, 622 Mb/s, 1 Gb/s, 2.5 Gb/s, 10 Gb/s, 40 Gb/s, and 100 Gb/s, N×1.25 Gb/s, and any rate in between. The line modules can include wavelength division multiplexing (WDM) interfaces, short reach interfaces, and the like, and can connect to other line modules on remote network elements, end clients, edge routers, and the like. From a logical perspective, the line modules provide ingress and egress ports to the node, and each line module can include one or more physical ports. The switch modules are configured to switch channels, timeslots, tributary units, etc. between the line module. For example, the switch modules can provide wavelength granularity (Layer 0 switching), SONET/SDH granularity such as Synchronous Transport Signal-1 (STS-1) and variants/concatenations thereof (STS-n/STS-nc), Synchronous Transport Module level 1 (STM-1) and variants/concatenations thereof, Virtual Container 3 (VC3), etc.; OTN granularity such as Optical Channel Data Unit-1 (ODU1), Optical Channel Data Unit-2 (ODU2), Optical Channel Data Unit-3 (ODU3), Optical Channel Data Unit-4 (ODU4), Optical Channel Data Unit-flex (ODUflex), Optical channel Payload Virtual Containers (OPVCs), ODTUGs, etc.; Ethernet granularity; Digital Signal n (DSn) granularity such as DS0, DS1, DS3, etc.; and the like. Specifically, the switch modules 630 can include both Time Division Multiplexed (TDM) (i.e., circuit switching) and packet switching engines. The switch modules can include redundancy as well, such as 1:1, 1:N, etc. In an exemplary embodiment, the switch modules provide OTN switching and/or Ethernet switching.

Those of ordinary skill in the art will recognize the node can include other components which are omitted for illustration purposes, and that the systems and methods described herein are contemplated for use with a plurality of different network elements with the node presented as an exemplary type of network element. For example, in another exemplary embodiment, the node may not include the switch modules, but rather have the corresponding functionality in the line modules (or some equivalent) in a distributed fashion. For the node, other architectures providing ingress, egress, and switching there between are also contemplated for the systems and methods described herein. In general, the systems and methods described herein contemplate use with any network element providing switching of OTN channels, timeslots, tributary units, wavelengths, etc. Furthermore, the node is merely presented as one exemplary node for the systems and methods described herein. Further the WDM functionality can be included in the node or in a separate node.

Figure 7:
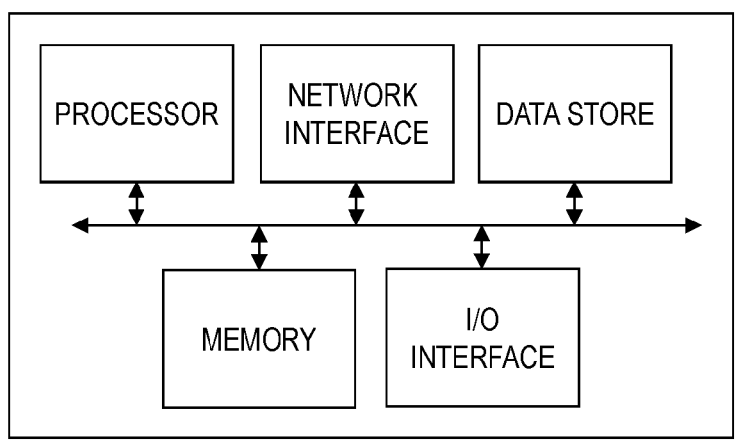
FIG. 7 is a block diagram illustrating a controller to provide control plane processing and/or operations, administration, maintenance, and provisioning (OAM&P) for the node of FIG. 6.

Referring now specifically to FIG. 7, in one exemplary embodiment, a controller is illustrated to provide control plane processing and/or operations, administration, maintenance, and provisioning (OAM&P) for the node. The controller can be part of common equipment, such as common equipment in the node, or a stand-alone device (e.g., a PCE) communicatively coupled to the node via the DCN. The controller can include a processor which is hardware device for executing software instructions such as operating the control plane. The processor can be any custom made or commercially available processor, a central processing unit (CPU), an auxiliary processor among several processors associated with the controller, a semiconductor-based microprocessor (in the form of a microchip or chip set), or generally any device for executing software instructions. When the controller is in operation, the processor is configured to execute software stored within memory, to communicate data to and from the memory, and to generally control operations of the controller pursuant to the software instructions. The controller can also include a network interface, a data store, memory, an I/O interface, and the like, all of which are communicatively coupled there between and with the processor.

The network interface can be used to enable the controller to communicate on the DCN, such as to communicate control plane information to other controllers, to the management system, and the like. The network interface can include, for example, an Ethernet card (e.g., 10BaseT, Fast Ethernet, Gigabit Ethernet) or a wireless local area network (WLAN) card (e.g., 802.11a/b/g). The network interface can include address, control, and/or data connections to enable appropriate communications on the network. The data store can be used to store data, such as control plane information, provisioning data, OAM&P data, etc. The data store can include any of volatile memory elements (e.g., random access memory (RAM, such as DRAM, SRAM, SDRAM, and the like)), nonvolatile memory elements (e.g., ROM, hard drive, flash drive, CDROM, and the like), and combinations thereof. Moreover, the data store can incorporate electronic, magnetic, optical, and/or other types of storage media. The memory can include any of volatile memory elements (e.g., random access memory (RAM, such as DRAM, SRAM, SDRAM, etc.)), nonvolatile memory elements (e.g., ROM, hard drive, flash drive, CDROM, etc.), and combinations thereof. Moreover, the memory may incorporate electronic, magnetic, optical, and/or other types of storage media. Note that the memory can have a distributed architecture, where various components are situated remotely from one another, but may be accessed by the processor. The I/O interface includes components for the controller to communicate to other devices. Further, the I/O interface includes components for the controller to communicate with the other nodes, such as using overhead associated with OTN signals.

It will be appreciated that some exemplary embodiments described herein may include one or more generic or specialized processors ("one or more processors") such as microprocessors, digital signal processors, customized processors, and field programmable gate arrays (FPGAs) and unique stored program instructions (including both software and firmware) that control the one or more processors to implement, in conjunction with certain non-processor circuits, some, most, or all of the functions of the methods and/or systems described herein. Alternatively, some or all functions may be implemented by a state machine that has no stored program instructions, or in one or more application specific integrated circuits (ASICs), in which each function or some combinations of certain of the functions are implemented as custom logic. Of course, a combination of the aforementioned approaches may be used. Moreover, some exemplary embodiments may be implemented as a non-transitory computer-readable storage medium having computer readable code stored thereon for programming a computer, server, appliance, device, etc. each of which may include a processor to perform methods as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer readable medium, software can include instructions executable by a processor that, in response to such execution, cause a processor or any other circuitry to perform a set of operations, steps, methods, processes, algorithms, etc.

Again, in various exemplary embodiments, the present invention also provides a cooling fan that incorporates a flange vibration isolator that is made of a polymeric material, such as polyurethane or the like, and that substantially matches the geometry of the cooling fan. The cooling fan also incorporates a rigid pin, such as a metallic pin. Preferably, the mounting flanges are located away from the fan inlet and exhaust, creating room for the vibration isolators without significantly increasing the cooling fan envelope. The vibration isolators are disposed on these mounting flanges and may be secured to the cooling fan using an adhesive, interference fit, or a fastener. The vibration isolators fit over the rigid pins, which are fitted to the cooling fan housing in the locations typically intended for mounting screws. Such assembly is repeated at each of the cooling fan mounting points—either four (two per side) or eight (four per side), as required. The vibration isolators dissipate the energy from vibration and prevent it from being communicated to the rest of the telecommunications system, while the rigid pins prevent large motions of the cooling fan inside the overall assembly. In addition to dissipating the energy from vibration, the vibration isolators are also used to ensure that an appropriate gap exists between the cooling unit and the surrounding metalwork.

Figure 8:
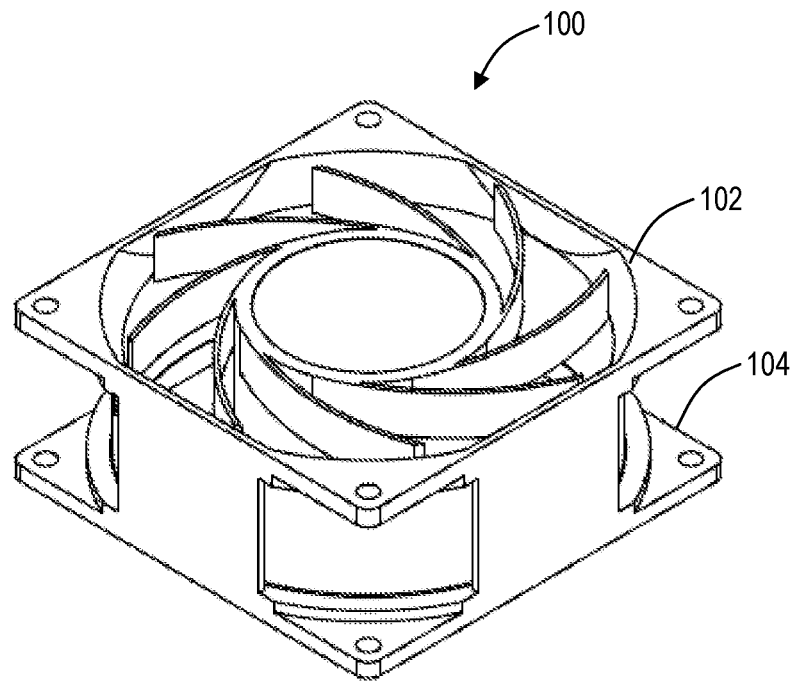
FIG. 8 is a perspective view illustrating a conventional cooling fan mounting flange configuration.

Again, the present state of the art requires a choice between either no vibration isolation, the use of relatively small vibration isolators, or the use of relatively large vibration isolators that require an increase in the size of a cooling unit, eliminating its feasibility in many applications Referring now specifically to FIG. 8, a conventional cooling fan 100 includes a fan assembly 102 that is coupled to a fan chassis (not illustrated) on its inlet side and its exhaust side. This coupling may be direct, through a variety of conventional vibration isolators, or through the vibration isolators described herein above. In all of these cases, the mounting flanges 104 are disposed flush with the surfaces of the inlet side and the exhaust side of the fan assembly 102. Thus, the vibration isolators, when used, must be disposed between the mounting flanges 104 and the fan chassis, or be disposed partially inside the mounting flanges 104. This limits their size and effectiveness.

Figure 9:
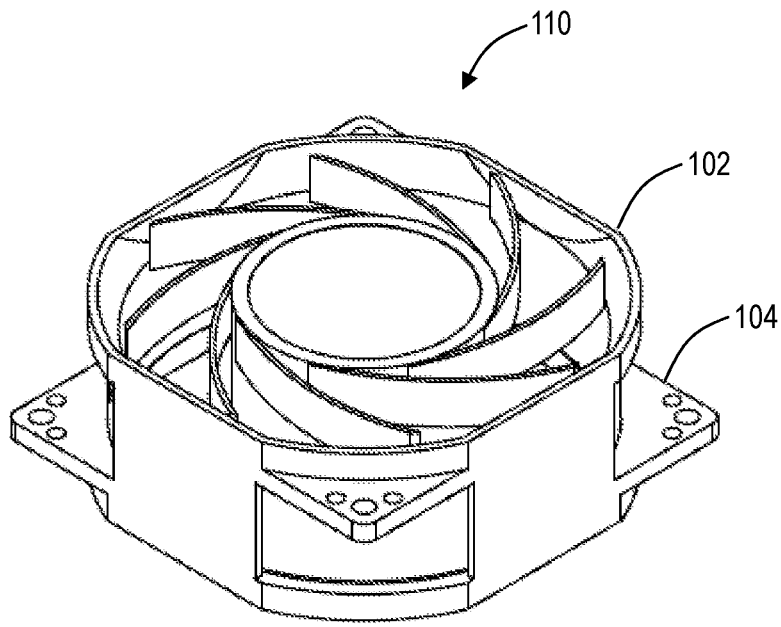
FIG. 9 is a perspective view illustrating one exemplary embodiment of the cooling fan mounting flange configuration of the present invention.

Referring now specifically to FIG. 9, in the cooling fan 110 of the present invention, the mounting flanges 104 are recessed and disposed above/beneath the surfaces of the inlet side and the exhaust side of the fan assembly 102. Thus, when the fan assembly 102 is coupled to the fan chassis (not illustrated), a space is formed between each mounting flange 104 and the fan chassis within the envelope of the fan assembly. This provides space for the vibration isolators of the present invention. It should be noted that, as illustrated, four mounting flanges 104 may be utilized (two on the inlet side of the fan assembly 102 and two on the exhaust side of the fan assembly 102). Alternatively, eight mounting flanges 104 may be utilized (four on the inlet side of the fan assembly 102 and four on the exhaust side of the fan assembly). The inlet side mounting flanges 104 may be offset from the exhaust side mounting flanges 104. In all embodiments, the vibration isolators of the present invention may be slightly larger than the space provided between the fan assembly 102 and the fan chassis, such that the fan assembly 102 is slightly spaced apart from the fan chassis. However, the bulk of each vibration isolator is disposed within the envelope of the fan assembly 102, such that the vibration isolators do not take up valuable volume in the overall system. As is described in greater detail herein below, these vibration isolators are relatively large due to their location and the configuration of the mounting flanges 104.

Figure 10:
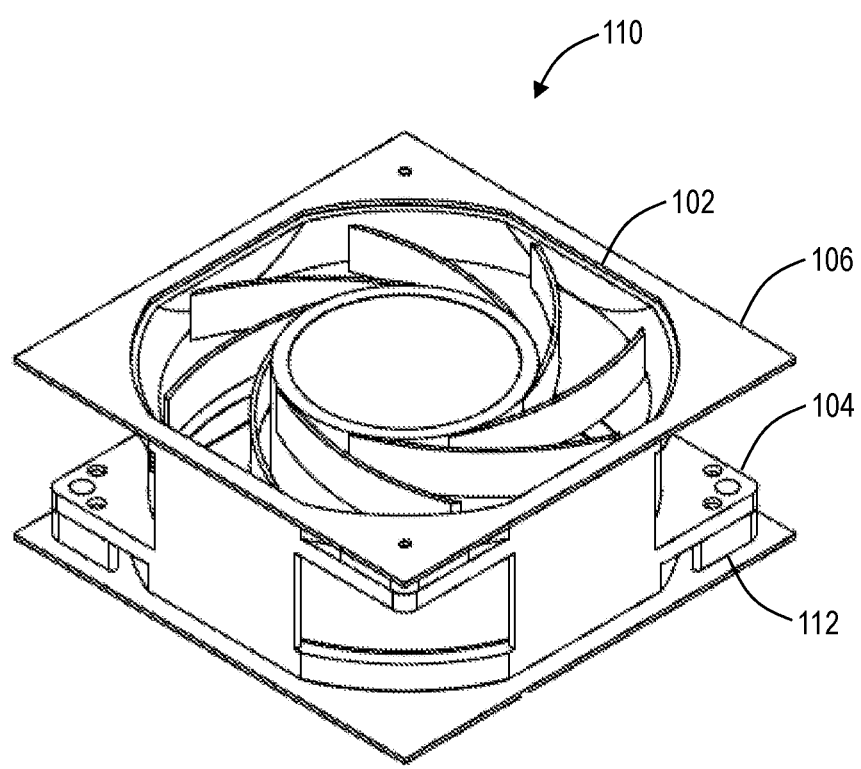
FIG. 10 is a perspective view illustrating one exemplary embodiment of the cooling fan mounting flange and vibration isolator configuration of the present invention.
Figure 11:
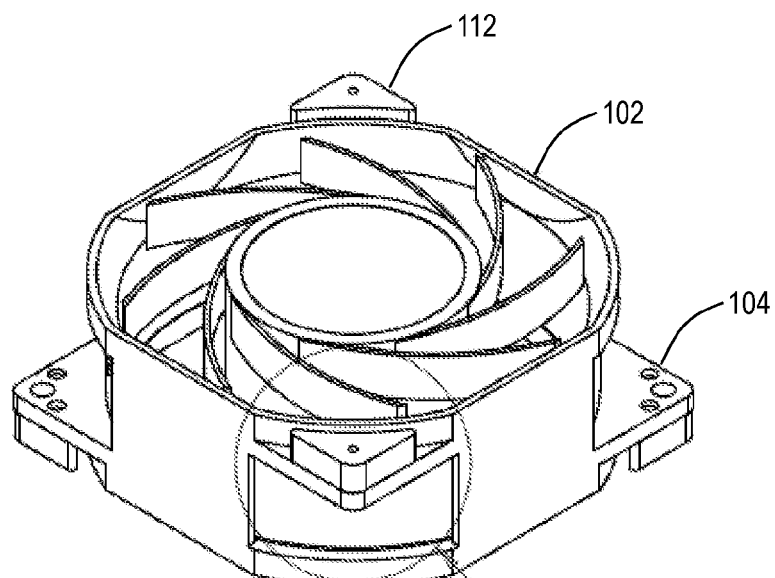
FIG. 11 is a partial perspective view of the cooling fan mounting flange and vibration isolator configuration of the FIG. 10 with the housing plates removed.
Figure 12:
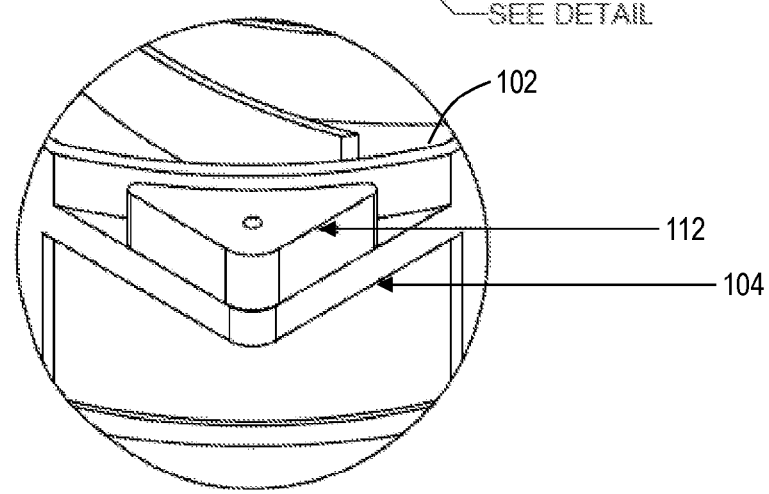
FIG. 12 is another partial perspective view of the cooling fan mounting flange and vibration isolator configuration of FIG. 10.

Referring now specifically to FIGS. 10-12, the vibration isolators 112 of the present invention are coupled to the outboard side of each of the mounting flanges 104, adjacent to the inlet port/exhaust port of the fan assembly 102, between each mounting flange 104 and the fan chassis 106 (FIG. 10). This coupling is achieved using an adhesive, an interference fit, and/or a fastener. In the exemplary embodiment illustrated, each of the vibration isolators 112 is a substantially triangular prismatic structure that substantially conforms to the shape of the mounting flange 104 to which it is attached, although such shape is not required, provided the vibration isolators 112 have sufficient size and volume to dampen any vibrations communicated from the fan assembly 102 to the fan chassis 106. The vibration isolators 112 may be partially hollow, incorporating one or more ribs and/or pockets—enhancing their performance and adding to their ease of assembly. As described herein above, the vibration isolators 112 may be made of a polymeric material, such as polyurethane or the like.

Figure 13:
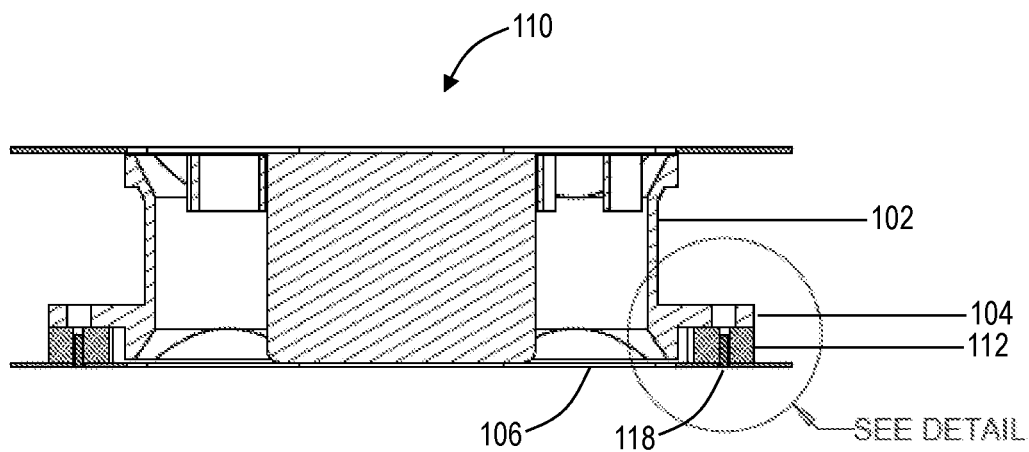
FIG. 13 is a cross-sectional side view of the cooling fan mounting flange and vibration isolator configuration of FIG. 10.
Figure 14:
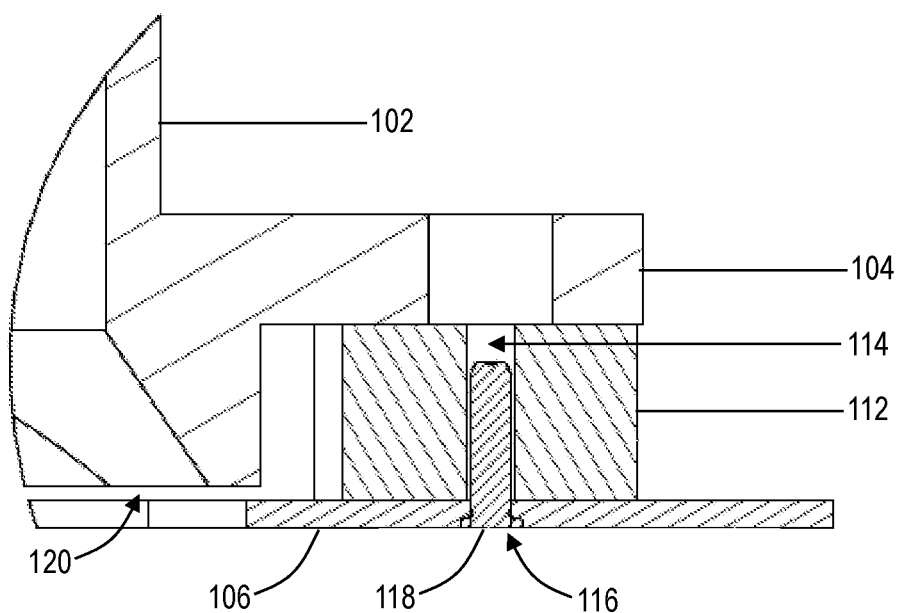
FIG. 14 is a partial cross-sectional side view of the cooling fan mounting flange and vibration isolator configuration of FIG. 10.

Referring now specifically to FIGS. 13 and 14, the configuration of each of the vibration isolators 112 is more clearly seen. Each of the vibration isolators 112 defines a hole 114 (FIG. 14) that corresponds to a hole 116 (FIG. 14) defined by the fan chassis 106. A rigid pin 118, optionally made of a metallic material, passes through the fan chassis 106 and into the hole 114 (FIG. 14) defined by the vibration isolator 112, which is itself coupled to the mounting flange 104, thereby coupling the fan assembly 102 to the fan chassis 106 through the vibration isolator 112. It will be readily apparent to those of ordinary skill in the art that other configurations may be utilized, provided that the fan assembly 102 is coupled to the fan chassis 106 through the recessed mounting flange 104 and the vibration isolator 112. FIG. 14 also more clearly illustrates the slightly oversized nature of the vibration isolators 112 and the small space 120 that is created between the fan chassis 106 and the fan assembly 102. This small space 120 allows the vibration isolators 112 to provide very effective vibration damping, essentially providing a cushion between the fan chassis 106 and the fan assembly 102, substantially within the envelope of the fan assembly 102. Thus, a relatively large vibration isolator 112 may be used with minimal size impact on the overall size or volume of the cooling unit.

Although the present invention is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A cooling fan assembly for use in a telecommunications system, the cooling fan assembly comprising:
    a cooling fan including a plurality of radially disposed mounting flanges that are recessed from both of an inlet surface and an exhaust surface of the cooling fan, wherein at least one of the mounting flanges is planar offset from at least one other of the mounting flanges;
    a chassis disposed adjacent to at least one of the inlet surface and the exhaust surface of the cooling fan, wherein a plurality of spaces are formed between the plurality of mounting flanges and the chassis;
    a plurality of vibration isolators disposed within the plurality of spaces formed between the plurality of mounting flanges and the chassis; and
    a plurality of rigid pins coupling the chassis to the plurality of vibration isolators.

2. The cooling fan assembly of claim 1, wherein the plurality of vibration isolators are disposed substantially within a volumetric envelope of the cooling fan and the plurality of mounting flanges.

3. The cooling fan assembly of claim 1, wherein the chassis is disposed adjacent to the at least one of the inlet surface and the exhaust surface of the cooling fan in a spaced apart relationship with the inlet surface and the exhaust surface of the cooling fan.

4. The cooling fan assembly of claim 1, wherein the plurality of vibration isolators are manufactured from a substantially compliant polymeric material.

5. The cooling fan assembly of claim 1, wherein the plurality of rigid pins are manufactured from a substantially rigid metallic material.

6. The cooling fan assembly of claim 1, wherein two mounting flanges and two vibration isolators are used on an inlet side of the cooling fan and two mounting flanges and two vibration isolators are used on an exhaust side of the cooling fan.

7. The cooling fan assembly of claim 1, wherein four mounting flanges and four vibration isolators are used on the inlet side of the cooling fan and four mounting flanges and four vibration isolators are used on the exhaust side of the cooling fan.

8. The cooling fan assembly of claim 1, wherein the plurality of vibration isolators are coupled to the plurality of mounting flanges via one or more of an adhesive, an interference fit, and a fastener.

9. The cooling fan assembly of claim 1, wherein at least one of the mounting flanges is radially offset from at least one other of the mounting flanges.

10. A method for vibrationally isolating a cooling fan assembly used in a telecommunications system, the method comprising:
providing a cooling fan including a plurality of radially disposed mounting flanges that are recessed from both of an inlet surface and an exhaust surface of the cooling fan, wherein at least one of the mounting flanges is planar offset from at least one other of the mounting flanges;
providing a chassis disposed adjacent to at least one of the inlet surface and the exhaust surface of the cooling fan, wherein a plurality of spaces are formed between the plurality of mounting flanges and the chassis;
disposing a plurality of vibration isolators within the plurality of spaces formed between the plurality of mounting flanges and the chassis; and
coupling the chassis to the plurality of vibration isolators using a plurality of rigid pins.

11. The method of claim 10, wherein the plurality of vibration isolators are disposed substantially within a volumetric envelope of the cooling fan and the plurality of mounting flanges.

12. The method of claim 10, wherein the chassis is disposed adjacent to the at least one of the inlet surface and the exhaust surface of the cooling fan in a spaced apart relationship with the inlet surface and the exhaust surface of the cooling fan.

13. The method of claim 10, wherein the plurality of vibration isolators are manufactured from a substantially compliant polymeric material.

14. The method of claim 10, wherein the plurality of rigid pins are manufactured from a substantially rigid metallic material.

15. The method of claim 10, wherein two mounting flanges and two vibration isolators are used on an inlet side of the cooling fan and two mounting flanges and two vibration isolators are used on an exhaust side of the cooling fan.

16. The method of claim 10, wherein four mounting flanges and four vibration isolators are used on the inlet side of the cooling fan and four mounting flanges and four vibration isolators are used on the exhaust side of the cooling fan.

17. The method of claim 10, wherein the plurality of vibration isolators are coupled to the plurality of mounting flanges via one or more of an adhesive, an interference fit, and a fastener.

18. The method of claim 10, wherein at least one of the mounting flanges is radially offset from at least one other of the mounting flanges.

19. A telecommunications shelf making up all or a portion of a telecommunications node, the telecommunications shelf comprising:
a cooling fan including a plurality of radially disposed mounting flanges that are recessed from both of an inlet surface and an exhaust surface of the cooling fan, wherein at least one of the mounting flanges is planar offset from at least one other of the mounting flanges;
a chassis disposed adjacent to at least one of the inlet surface and the exhaust surface of the cooling fan, wherein a plurality of spaces are formed between the plurality of mounting flanges and the chassis;
a plurality of vibration isolators disposed within the plurality of spaces formed between the plurality of mounting flanges and the chassis; and
a plurality of rigid pins coupling the chassis to the plurality of vibration isolators.

20. The telecommunications shelf of claim 19, wherein the chassis is disposed adjacent to the at least one of the inlet surface and the exhaust surface of the cooling fan in a spaced apart relationship with the inlet surface and the exhaust surface of the cooling fan.

* * * * *